US006983404B2

(12) United States Patent
Cutter et al.

(10) Patent No.: US 6,983,404 B2
(45) Date of Patent: Jan. 3, 2006

(54) METHOD AND APPARATUS FOR CHECKING THE RESISTANCE OF PROGRAMMABLE ELEMENTS

(75) Inventors: Douglas J. Cutter, Fort Collins, CO (US); Adrian E. Ong, Pleasanton, CA (US); Fan Ho, Sunnyvale, CA (US); Kurt D. Beigel, Boise, ID (US); Brett M. Debenham, Meridian, ID (US); Dien Luong, Boise, ID (US); Kim Pierce, Meridian, ID (US); Patrick J. Mullarkey, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/777,036

(22) Filed: Feb. 5, 2001
(Under 37 CFR 1.47)

(65) Prior Publication Data

US 2005/0005208 A1    Jan. 6, 2005

Related U.S. Application Data

(63) Continuation of application No. 08/813,525, filed on Mar. 7, 1997, now Pat. No. 6,185,705.

(51) Int. Cl.
*G11C 29/00*    (2006.01)

(52) U.S. Cl. .................................. 714/721; 714/736

(58) Field of Classification Search ............... 365/201, 365/210; 324/713, 550, 705, 537; 714/721, 714/736
See application file for complete search history.

(56) References Cited

U.S. PATENT DOCUMENTS

| 4,290,013 A |   | 9/1981  | Thiel ........................... 324/73 |
|-------------|---|---------|------------------------------------------|
| 4,698,589 A | * | 10/1987 | Blankenship et al. ........ 365/201 |
| 4,841,286 A |   | 6/1989  | Kummer ..................... 340/653 |
| 5,293,133 A | * | 3/1994  | Birkner et al. .............. 324/713 |
| 5,323,377 A |   | 6/1994  | Chen et al. .................. 369/126 |
| 5,414,364 A | * | 5/1995  | McCollum ................... 324/550 |
| 5,469,396 A | * | 11/1995 | Eltoukhy .................... 365/210 |
| 5,502,395 A |   | 3/1996  | Allen .......................... 324/713 |
| 5,612,623 A |   | 3/1997  | Watanabe et al. ........... 324/549 |
| 5,635,854 A |   | 6/1997  | Shimanek et al. ............ 326/38 |
| 5,694,047 A | * | 12/1997 | Goetting et al. ............ 324/705 |
| 5,952,833 A | * | 9/1999  | Morgan ...................... 324/537 |

* cited by examiner

*Primary Examiner*—David Ton
(74) *Attorney, Agent, or Firm*—Fletcher Yoder P.C.

(57) ABSTRACT

Method and apparatus are disclosed for checking the resistance of antifuse elements in an integrated circuit. A voltage based on the resistance of an antifuse element is compared to a voltage based on a known resistance, and an output signal is generated whose binary value indicates whether the resistance of the antifuse element is higher or lower than the known value of resistance. The method and apparatus are useful in verifying the programming of antifuse elements.

21 Claims, 5 Drawing Sheets

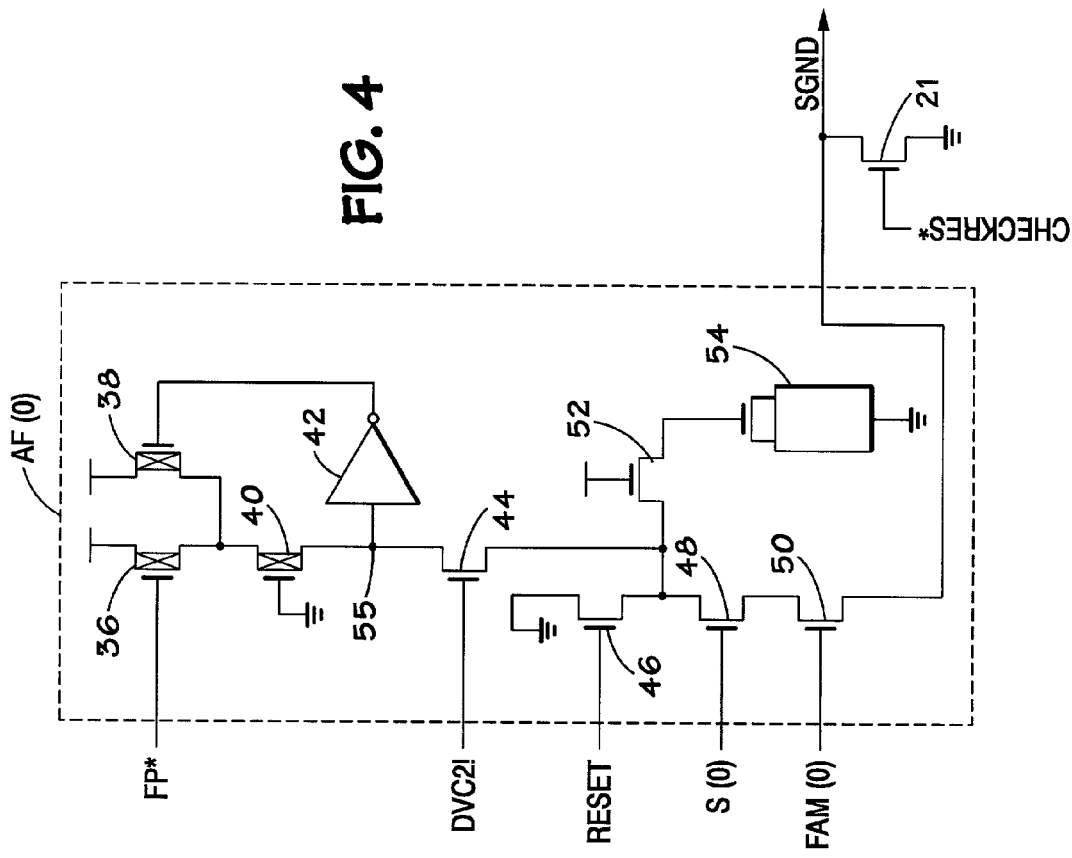
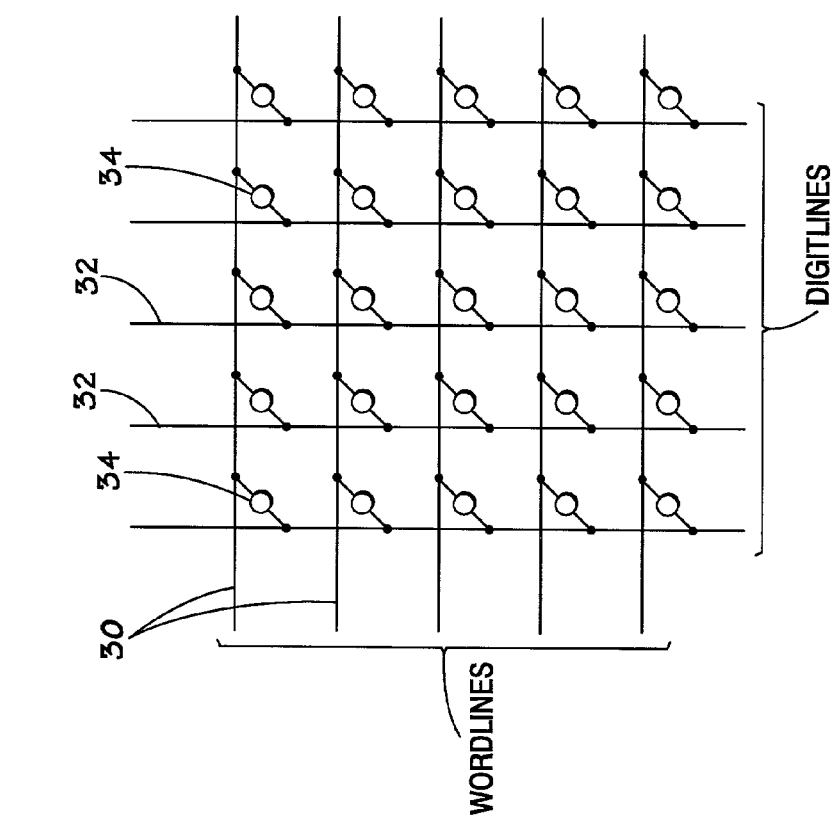

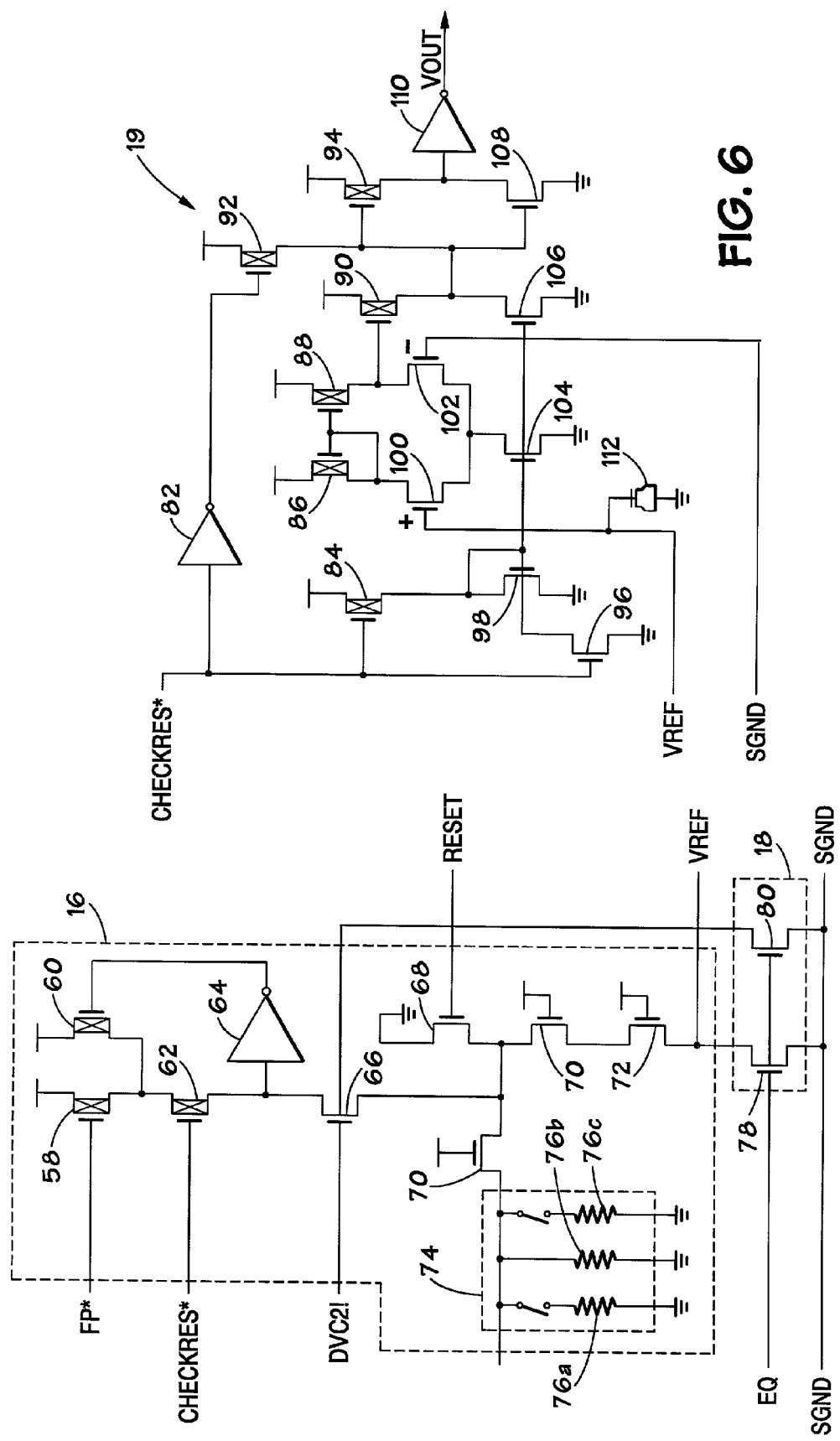

METHOD AND APPARATUS FOR CHECKING THE RESISTANCE OF PROGRAMMABLE ELEMENTS

This application is a Continuation of application Ser. No. 08/813,525, filed Mar. 7, 1997, now U.S. Pat. No. 6,185,705.

CROSS-REFERENCE TO OTHER APPLICATIONS

Filed on the same date as this application is U.S. patent application of Don Morgan, Entitled: "SIMPLE FUSE MARGIN TEST CIRCUIT;" and U.S. patent application of Douglas J. Cutter, Fan Ho, Kurt D. Beigel, Brett M. Debenham, Dien Luong, Kim M. Pierce, and Patrick J. Mullarkey, Entitled: "METHOD AND APPARATUS FOR CHECKING THE RESISTANCE OF PROGRAMMABLE ELEMENTS."

BACKGROUND OF THE INVENTION

1. Field of the Invention

The present invention relates to integrated circuit products, and more particularly, to method and apparatus for verifying the programming of antifuse elements in integrated circuits.

2. Description of the Related Art

Contemporary memory products require a high degree of redundancy in order to improve manufacturing yields. Present redundancy techniques in memory products include providing extra memory array columns and/or extra memory array rows which can be used to replace defective columns and/or rows.

Antifuses have been used as nonvolatile programmable memory elements to store logic states for implementing row and column redundancy in DRAMs. When used for redundancy implementation, antifuses are usually constructed in the same manner as the memory cell capacitors in the DRAM array. However, antifuses have other uses in memory products besides redundancy implementation. Antifuses may, for example, be used in integrated circuit memory as a mechanism for changing the operating mode of the memory or may be programmed to encode identification information about the memory, e.g., fabrication date.

An antifuse is, by definition, a two-terminal device which functions as an open circuit until programmed. Ideal programming of an antifuse results in a permanent short circuit existing between the two terminals. However, programming usually results in a resistance existing between the two terminals. The magnitude of this resistance is an indicator of whether the antifuse was successfully programmed.

Determining the resistances of antifuses in a DRAM has traditionally been accomplished by placing a DRAM in an automated circuit testing device (commonly referred to as Automated Test Equipment or ATE) and measuring the resistance of each antifuse parametrically. The measurement procedure involves physically measuring the current draw through each antifuse using a prober or similar measurement instrument. The process of measuring the current draw of individual antifuses requires placement of the probe and generation of several signals to and from the ATE. Even with the speed and sophistication of existing probers, the procedure routinely consumes 10 to 20 milliseconds per antifuse.

In a past era when 4 Megabit DRAMs represented the leading edge in DRAM sophistication, measurement times of 10 to 20 milliseconds per antifuse yielded acceptable economics for manufacturers. This was due to the relatively small number of antifuses per DRAM (approximately 20). However, the number of antifuses in a typical DRAM has increased dramatically as the circuit density of DRAMs has increased. Whereas a 4 Megabit DRAM may contains approximately 20 antifuses, a 64 Megabit DRAM may have approximately 640 antifuses, and a 256 Megabit DRAM some 5000. The time required to measure the antifuse programming for such higher density DRAMs using conventional parametric methods represents a significant strain on manufacturing efficiency.

SUMMARY OF THE INVENTION

In one aspect of the present invention, a method of checking the resistance of an antifuse element in an integrated circuit is provided. The method includes the step of producing a first voltage at a first node based based on the resistance of an antifuse element and producing a second voltage at a second node based on a known resistance. The first voltage is then compared to the second voltage and an output signal is produced in response to the comparison of the first and second voltages. The binary value of the output signal indicates whether the resistance of the antifuse element is higher or lower than the known resistance.

In another aspect of the present invention, an apparatus for checking the resistance of anti fuse elements in an integrated circuit is provided. The apparatus includes circuitry defining a bit of antifuse. The circuitry defining the bit of antifuse includes an antifuse element that has a resistance. The circuitry defining the bit of antifuse also includes a first node at which a voltage may be developed that is based on the resistance of the antifuse element. The apparatus also includes circuitry for producing a reference voltage at a second node. The reference voltage is based on the value of a known resistance. Finally, the apparatus includes circuitry which compares the voltage on the first node to the reference voltage on the second node and which produces an output signal whose binary value indicates whether the value of the resistance of the antifuse element is higher or lower than the value of the known resistance.

In a further aspect of the present invention, an apparatus in an integrated circuit is provided. The apparatus includes a plurality of bits of antifuse. Each bit of antifuse includes an antifuse element that has a resistance, and a first node at which a voltage may be developed that is based on the resistance of the antifuse element. The first nodes of all bits of antifuse are joined in a common connection. The apparatus also includes selection circuitry for selecting one of the bits of antifuse, and circuitry for producing a reference voltage at a second node. The reference voltage is based on the value of a known resistance. Finally, the apparatus includes circuitry which compares the voltage at the first node of the selected bit of antifuse to the reference voltage at the second node and which produces an output signal whose binary value indicates whether the value of the resistance of the antifuse element in the selected bit of antifuse is higher or lower than the value of the known resistance.

In still another aspect of the present invention, an integrated circuit is provided that includes a plurality of bits of antifuse. Each bit of antifuse includes an antifuse element that has a resistance and a first node at which a voltage may be developed that is based on the resistance of the antifuse element. The first nodes of all bits of antifuse are joined in a common connection. There is a decoder for decoding a first address signal and sending a first enabling signal to each of the plurality of bits of antifuse. A reference circuit is provided for producing a reference voltage at a second node. The reference voltage is based on the value of a known resistance. Finally, there is a comparator circuit which compares the voltage at the first node of the selected bit of antifuse to the reference voltage at the second node and which produces an output signal whose binary value indicates whether the value of the resistance of the antifuse element in the selected bit of antifuse is higher or lower than the value of the known resistance.

In yet a further aspect of the present invention, a semiconductor memory device is provided that includes a memory array and a plurality of bits of antifuse. Each bit of antifuse includes an antifuse element that has a resistance and a first node at which a voltage may be developed that is based on the resistance of the antifuse element. The first nodes of all bits of antifuse are joined in a common connection. Means are provided for producing a first voltage at a first node based on a known resistance. In addition, means are provided for producing a second voltage at a second node based on the resistance of an antifuse element. Finally, means are provided for comparing the first voltage to the second voltage and for producing an output signal in response to the comparison, the binary value of the output signal indicating whether the resistance of the antifuse element is higher or lower than the known resistance.

BRIEF DESCRIPTION OF THE DRAWINGS

Other objects and advantages of the invention will become apparent upon reading the following detailed description and upon reference to the drawings in which:

FIG. 3 is a schematic diagram of a portion of a memory array in the semiconductor device of FIG. 2;

FIG. 4 is a schematic diagram which illustrates an embodiment of each bit of antifuse, AF(i) of FIG. 1;

FIG. 5 is a schematic diagram which illustrates an embodiment of reference circuit 10 of FIG. 1;

FIG. 6 is a schematic diagram illustrating an embodiment of comparator circuit 16 of FIG. 1;

DETAILED DESCRIPTION OF SPECIFIC EMBODIMENTS

Figure 1:
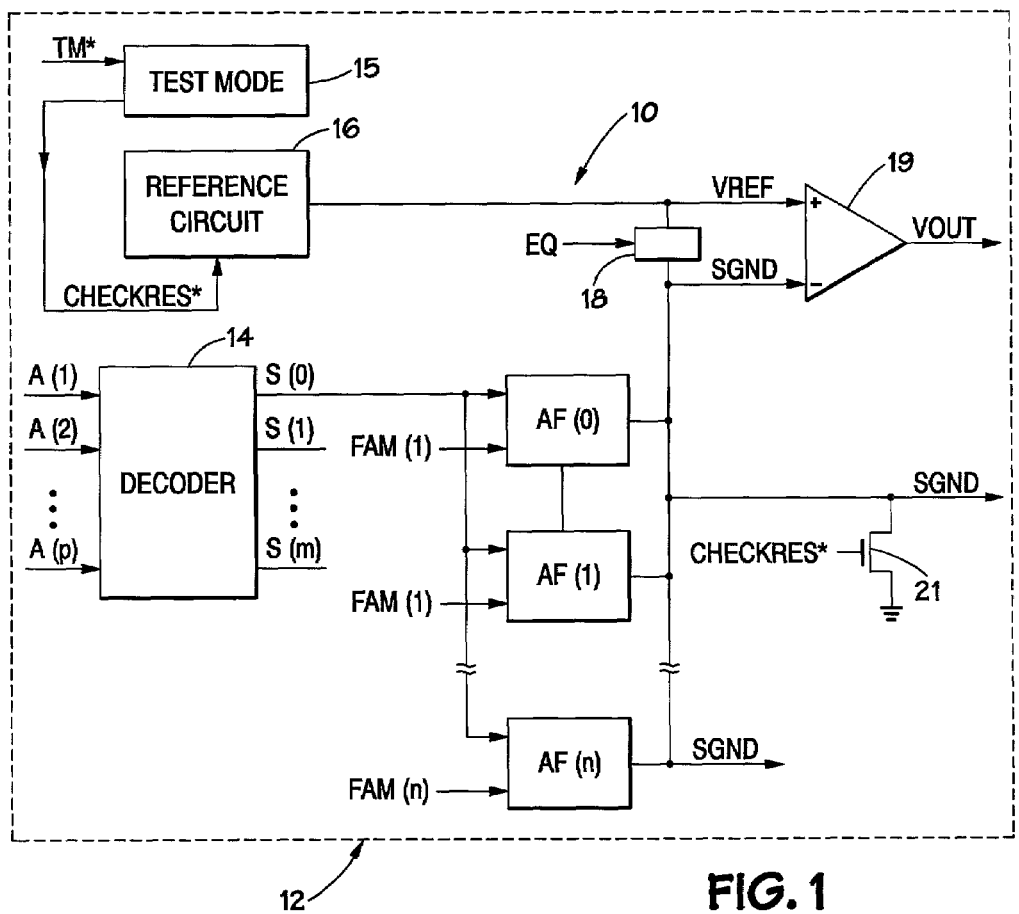
FIG. 1 is a schematic diagram in block diagram form of one embodiment of apparatus in accordance with the present invention.

Referring first to FIG. 1, an apparatus 10 for testing the resistance of programmable elements in an integrated circuit 12 in accordance with the present invention is depicted. The apparatus 10 is designed to receive various activation and address signals from an external test apparatus (not shown), such as, for example, a piece of automated test equipment (ATE). The apparatus 10 includes an address decoder 14, a test mode circuit 15, a reference circuit 16, a plurality of programmable circuits AF(i), where i=0, 1, 2 . . . n, an equilibration circuit 18, and a comparator 19. The invention is described herein using antifuses as an example of a programmable element. However, the skilled artisan should appreciate that the following description is applicable to resistance measurement of fuses, antifuses, ovonic devices, or like programmable elements. The outputs of the antifuses AF(i) are commonly connected to one input of the equilibration circuit 18 and one input of the comparator 19. The signal designated SGND identifies this common connection. The voltage on SGND is grounded via n-channel transistor 21 when the resistance checking process is not being performed. The transistor 21 may have a width to length ratio of 1000/6.

Figure 2:
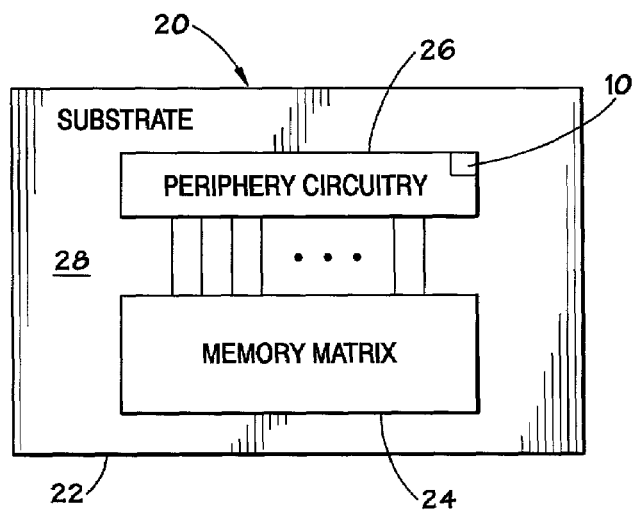
FIG. 2 is a schematic diagram in block diagram form of a semiconductor memory device in accordance with the present invention.

As shown in FIG. 2, the apparatus 10 may be incorporated directly into a semiconductor memory device 20. The memory device 20 includes a memory array 24 and associated periphery circuitry 26 disposed on a semiconductor substrate 28. The memory array 24 consists of a plurality of rows of wordlines 30 crisscrossed by a plurality of columns of digitlines 32 as shown in FIG. 3. The wordlines 30 and the digitlines 32 connect a plurality of memory cells 34. Just a small portion of the memory array 24 is shown in FIG. 2.

The antifuses in the integrated circuit 12 are arranged in a number of banks, and one such bank AF(0) . . . AF(n) is shown in FIG. 1. A particular one of the m banks of antifuses is selected during a resistance checking process by activating the enabling signal S(i), i=0, 1, 2 . . . m for that bank via the ATE. By way of illustration, the bank of antifuses shown in FIG. 1 is selected by bank select signal S(0). The S(i) signals may, for example, correspond to memory row address signals A(0), A(1) . . . A(p) received from the ATE, which are decoded by the decoder 14.

A particular antifuse within the selected bank is selected during a resistance checking process by activating the enabling signals FAM(k), k=0, 1, 2 . . . n for that particular antifuse via the ATE. The FAM(k) signals may, for example, correspond to memory column address signals FAM(0), FAM(1) . . . FAM(n) received from the ATE. The sequential addressing of each antifuse within the bank, e.g., the sequential enabling of signals FAM(k), is accomplished by toggling a signal CAS, which is generated by the ATE.

With reference now to FIG. 4, there is illustrated an embodiment of an antifuse AF(0), which is illustrative of the antifuses AF(0) . . . AF(n). As illustrated, the antifuse AF(0) includes p-channel transistors 36, 38, and 40, an inverter 42, n-channel transistors 44, 46, 48, 50, and 52, and programmable or antifuse element 54, all connected as shown in FIG. 4. The signal DVC2! is a voltage which is generated in the integrated circuit 12 and has a magnitude of approximately $V_{cc}/2$ volts, e.g., approximately +1.5 volts for a 3.3 volt part. The transistor 46 is gated to a RESET signal that is generated by the test mode circuit 15. Before a particular antifuse, such as AF(0), is programmed, RESET is set high to ensure there is no charge on the antifuse element 54 prior to programming.

In this embodiment, the width to length ratio (W/L) of the transistors in the antifuse AF(0) are as follows: (a) transistors 36 and 38: 16/4; (b) transistor 40: 16/300; (c) transistor 44: 40/4; (d) transistor 46: 40/6; and (e) transistors 48, 50, and 52: 200/6. Furthermore, the p-channel transistor in the inverter 42 has a W/L ratio of 40/6, and the n-channel transistor in the inverter 42 has a W/L ratio of 40/4.

The p-channel transistors 36, 38, and 40, in conjunction with the inveter 42, form a latch node 55 that is designed to match the logic state of the antifuse element 54, e.g., programmed or unprogrammed. As discussed below, when the integrated circuit 12 is in an antifuse resistance checking mode, the latch node 55 is isolated from the antifuse element 54 by the transistor 44. However, when the integrated circuit 12 is in a normal operating mode, the latch node 55 is designed to limit current to a programmed antifuse element, such as 54, and conversely, to allow current to charge up node 55 if the antifuse element is unprogrammed.

To enable the latch node 55 to latch in a state consistent with the programming state of the antifuse element 54, the p-channel transistor 36 is gated to a signal, FP*, that is generated external to the integrated circuit 12 and is capable of toggling from high to low. When the integrated circuit 12 is in a normal operating mode and the antifuse element 54 is unprogrammed, the FP* signal is held high after pulsing low at least once after powerup. The pulse allows node 55 to charge and cause the output of inverter 42 to go low, thus tuning on transistor 38. When FP* is held high hereafter, the current path through transistor 38 holds node 55 high and latched. Conversely, when the integrated circuit 12 is in a normal operating mode and the antifuse element 54 is programmed, node 55 is pulled to a voltage below the trip point of the inverter 42 causing the output of inverter 42 to go high, thereby shutting off transistor 38. With no path to VCC once FP* is high, and a resistive short to ground, node 55 is held low.

As a result of commonly encountered manufacturing process variations, there may be variations in the resistance of each antifuse element after programming. If the resistance of a given antifuse element, such as 54, is close enough to, or greater than, the resistance of the transistor 40, there is the possibility that the inverter 42 will read the antifuse element 54 as unprogrammed and latch high. To guard against this potential device conflict, the transistor 40 should have a resistance that is considerably greater than the anticipated maximum resistance of the programmed antifuse element 54.

With reference to FIG. 5, there is illustrated an embodiment of the reference circuit 16. The reference circuit 16 includes p-channel transistors 58, 60, 62, an inverter 64, n-channel transistors 66, 68, 70, 72, 73, and a resistor network 74, all connected as shown in FIG. 5. The reference circuit 16 functions to produce a reference voltage, VREF, at its output node that is based on the known resistance in the reference circuit 16. The voltage VREF is compared to the voltage on the node SGND produced by a particular antifuse AF(i). The reference circuit 16 is structurally similar to each bit of antifuse AF(i), and is intended to produce VREF while mimicking the electrical behavior of a given bit of antifuse AF(i). To this end, the p-channel transistors 58, 60, and 62 and the inverter 64 form a latch as described above, though with the transistor 62 now gated to CHECKRES*. The transistors 70 and 72 mimick the resistances associated with transistors 48 and 50 shown in FIG. 4. The transistor 68 functions as a reset as shown in FIG. 4.

In the embodiment in FIG. 5, the width to length ratio (W/L) of the transistors in this embodiment of the reference circuit 16 are as follows: (a) transistors 58 and 60: 16/4; (b) transistor 62: 16/300; (c) transistor 66: 40/4; (d) transistor 68: 40/6; and (e) transistors 70, 72, and 73: 200/6. The p-channel transistor in the inverter 64 has a W/L ratio of 40/6, and the n-channel transistor in the inverter 64 has a W/L ratio of 40/4.

The resistor network 74 is designed to provide the known resistance upon which VREF is based. The skilled artisan will appreciate that it is desirable to set the threshold resistance of a given antifuse AF(i) that will be read by the comparator 20 as reflecting an unprogrammed antifuse. To this end, the resistor network 74 is configured to provide a known resistance that represents the minimum resistance that will be read as indicating an unprogrammed antifuse. Although a resistor network 74 is used to provide the known minimum resistance, a transistor with a known resistance may be used as well. In an embodiment of the present invention, the resistor network 42 includes a plurality of resistors which may be interconnected in serial or parallel relationship as desired. In FIG. 5, three such resistors are shown, namely: 76a having a value 50 KΩ; 76b having a value of 100 KΩ; and 76c having a value of 200 KΩ. Thus, in the configuration shown in FIG. 5, 150 KΩ is the value of the known resistance in the reference circuit 16.

Referring to FIGS. 1 and 5, the equilibration circuit 18 consists of two n-channel transistors 78 and 80 parallel connected as shown. When the equilibrate pulse EQ is active, the transistors 78 and 80 are enabled and the voltage on the nodes designated VREF and SGND are equalized or balanced at approximately DVC! or $V_{cc}/2$ volts. Transistor 78 has a W/L ratio of 20/4, and transistor 80 has a W/L ratio of 60/4.

With reference to FIG. 6, there is illustrated an embodiment of the comparator circuit 19 of FIG. 1. The comparator circuit 19 includes an inverter 82, p-channel transistors 84, 86, 88, 90, 92, and 94, n-channel transistors 96, 98, 100, 102, 104, 106, and 108, an inverter 110 and a capacitor 112 (whose function is to match the capacitive load of the SGND line), all connected as shown. The comparator circuit 19 functions to compare the voltages VREF and SGND and to produce an output signal whose binary value is indicative of the resistance of the antifuse element in the selected antifuse AF(i). In an embodiment of the present invention, VREF will be greater in magnitude than SGND if the resistance of the antifuse element in the selected antifuse AF(i) is less than the known resistance in reference circuit 16 upon which VREF is based, and the output of comparator circuit 19 will be zero volts. When apparatus of the present invention is being used to verify antifuse programming, such conditions indicate that the antifuse element has been properly programmed.

In the embodiment shown in FIG. 6, the width to length ratio of the transistors in FIG. 6 are as follows: (a) transistor 61: 50/300; (b) transistors 62, 63, 65, 71–73: 100/6; (c) transistors 64, 65, 69, and 70: 200/6; and (d) transistors 67 and 68: 50/6.

With reference to FIGS. 1 and 4–7, the process of checking the resistance of the antifuse AF(0) commences on the active low state of the signal CHECKRES*, which is generated by the test mode circuit 15 in response to receiving a test mode signal TM* that initiates a test. The bit of antifuse whose resistance is to be checked is selected as described above. Initially, the magnitude of the voltages VREF and SGND are unknown; however, upon application of the equilibrate pulse EQ, the voltages VREF and SGND are equilibrated, or balanced, at a voltage of approximately $V_{cc}/2$ volts.

Figure 7:
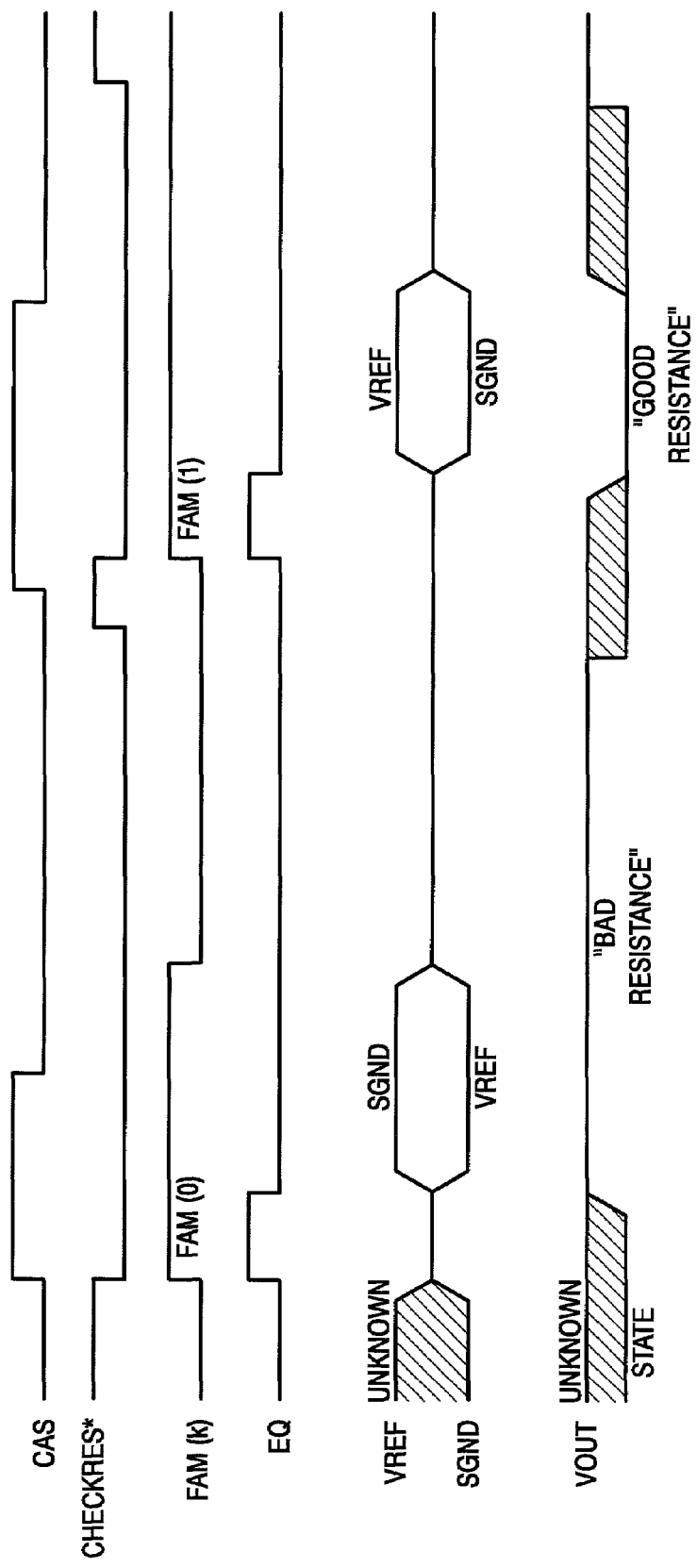
FIG. 7 is a timing diagram which illustrates timing relationships of signals used in an embodiment of the present invention.

Following the active state of the EQ pulse, the magnitudes of the voltages VREF and SGND will change depending on the resistances on which they are respectively based. In FIG. 7, SGND is first shown for the antifuse AF(0) enabled by FAM(0) as being higher in magnitude than VREF, which indicates that the resistance of the antifuse element 54 in the selected antifuse AF(0) is greater than the resistance in the reference circuit 16 on which VREF is based. In this situation, VOUT of the comparator circuit 20 will be $V_{cc}$ or a high voltage.

FIG. 7 depicts the condition for the next antifuse AF(1), which is selected by FAM(1). In this case, SGND is lower in magnitude than VREF, which indicates that the resistance of the selected antifuse AF(1) is less than the resistance in reference circuit 16 on which VREF is based. In this situation, VOUT of the comparator circuit 20 will be at zero volts. VOUT may be sampled at an appropriate time after the active state of signal EQ has terminated.

Figure 8:
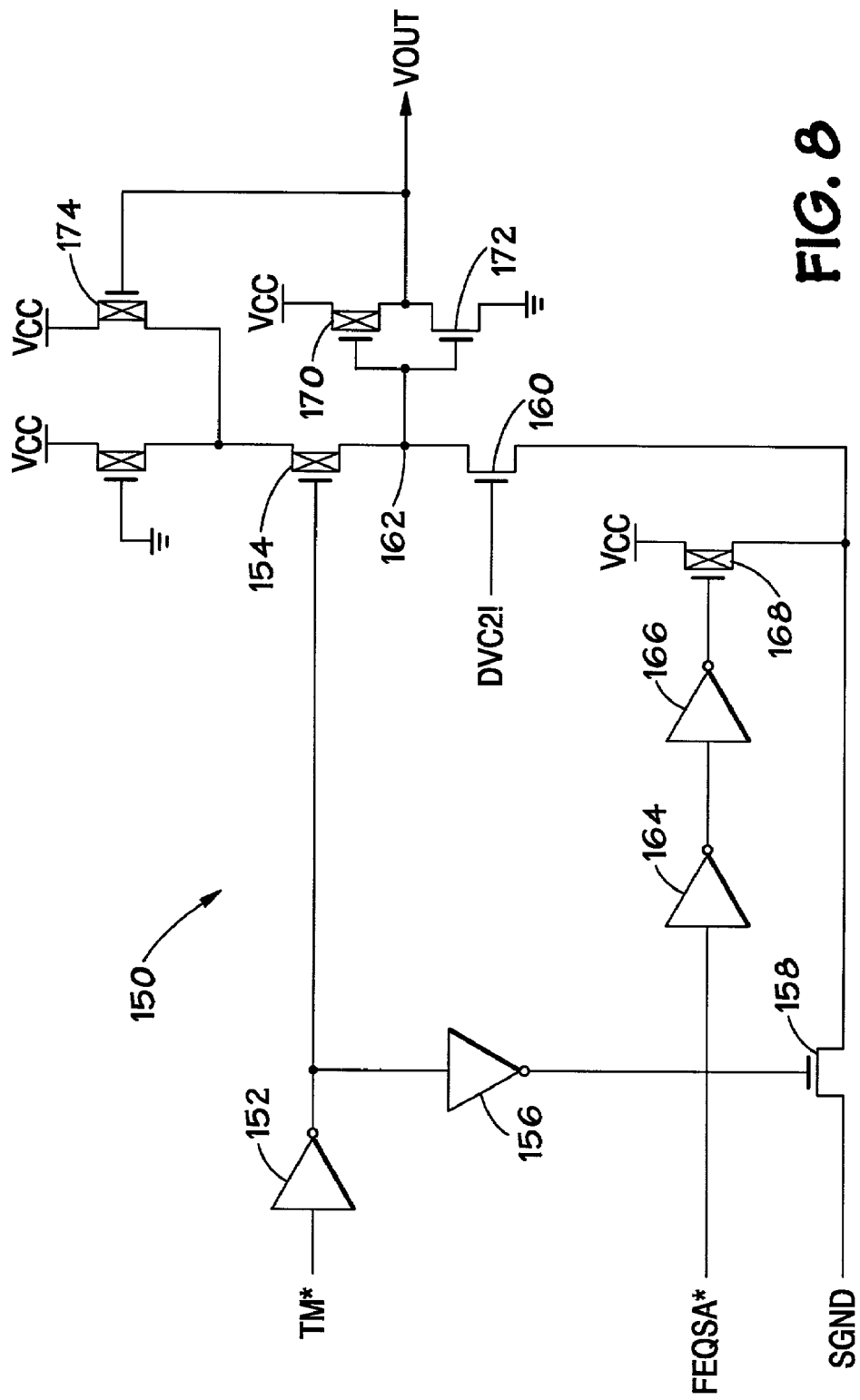
FIG. 8 illustrates an alternate embodiment of the present invention.

It has been found that the comparator circuit 19 and reference circuit 16, described above, may be slower than desirable in certain applications. Thus, to speed operation, the reference generation and comparison may be made using the circuitry 150 illustrated in FIG. 8 instead. As can be seen, certain portions of the alternative circuitry illustrated in FIG. 8 are quite similar to the circuitry illustrated in FIG. 4, and it operates in a similar manner as well. However, although the following discussion may contain some redundancies, the operation of this alternative circuit 150 will be described in detail.

Like the previously described embodiment, the test mode is initiated by the transition of the test mode signal TM* from a logical 0 to a logical 1. The test mode signal TM* is received by an inverter 152, which delivers a logical 0 to the gate of the p-channel transistor 154 to turn it on. The width to length ratio of the transistor 154 is selected so that the transistor 154 simulates a reference resistor to generate a reference signal at a node 162. The width to length ratio may be about 4:25, although a longer length may be used to increase the reference resistance to increase the chance that a comparison with the signal SGND, as described below, will indicate that the antifuse has been blown or programmed.

An inverter 156 also receives this logical 0 signal from the inverter 152. Accordingly, the inverter 156 delivers a logical 1 signal to the gate of the n-channel transistor 158 to turn it on. The signal SGND depicting the resistive state of the antifuse being checked is, thus, gated to the remaining portion of the circuit 150 to determine the state of the antifuse.

At this time, the signal DVC2! received by the gate of the n-channel transistor 160 is high to turn on the transistor 160. Thus, the signal SGND is coupled to the node 162, as is the reference resistance signal from the transistor 154. Similar to the equilibration described in reference to the previous embodiment, a signal FEQSA* toggles from a logical 0 to a logical 1 each time a different antifuse is tested. The signal FEQSA* may be sent through a pair of inverters 164 and 166 used to drive the gate of a p-channel transistor 168. The transistor 168 is tied to Vcc to attempt to pull the signal SGND high in order to balance the signals impinging on the node 162.

If the signal SGND is greater in magnitude than the reference resistance signal from the transistor 154, this signifies that the antifuse has not been blown. A logical 1 will appear at the node 162 as an input to the inverter formed by the p-channel transistor 170 and the n-channel transistor 172. Thus, the gate of the p-channel transistor 174 receives a logical 0, which turns on the transistor 174. As a result, the voltage Vcc experiences small voltage drops across the transistor 174 and the transistor 154 to maintain the node 162 at a logical 1. Therefore, the output of the inverter formed by the transistors 170 and 172 remains at a logical 0 to indicate that the antifuse has not been blown.

By contrast, if the signal SGND is lower in magnitude than the reference resistance signal from the transistor 154, this signifies that the antifuse has been blown. A logical 0 will appear at the node 162 as an input to the inverter formed by the p-channel transistor 170 and the n-channel transistor 172. Thus, the gate of the p-channel transistor 174 receives a logical 1, which turns off the transistor 174. As a result, the voltage Vcc drops across the transistor 174 to maintain the node 162 at a logical 0. Therefore, the output of the inverter formed by the transistors 170 and 172 remains at a logical 1 to indicate that the antifuse has been blown.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of determining whether a programmable element in an integrated circuit has been programmed, comprising the acts of:
   producing a first voltage at a first node based on a resistance of the programmable element;
   producing a second voltage at a second node based on a known resistance; and
   comparing the first and second voltages and producing an output signal having a binary value in response to the comparison, the binary value of the output signal indicating whether the programmable element has been programmed.

2. The method of claim 1, comprising the acts of:
   equilibrating the voltages at the first and second nodes; and
   performing the act of comparing the first and second voltages after sufficient time has elapsed to allow the first and second voltages to change, respectively, based on the known resistance and the resistance of the programmable element.

3. The method of claim 2, wherein the voltages at the first and second nodes are equilibrated at the same approximate voltage between $V_{cc}$ and zero volts.

4. A method of determining whether a programmable element in an integrated circuit has been programmed, the method comprising the acts of:
   providing a first node at which a first voltage is produced based on a resistance of the programmable element;
   providing a second node at which a second voltage is produced based on a known resistance;
   equilibrating the voltages at the first and second nodes; and
   comparing the voltages at the first and second nodes and producing an output signal having a binary value in response to the comparison, the binary value of the output signal indicating whether the programmable element has been programmed.

5. An apparatus for determining whether a programmable element in an integrated circuit has been programmed, the apparatus comprising:
   a programmable circuit comprising:
      a programmable element having a resistance; and
      a first node at which a voltage may be developed that is based on the resistance of the programmable element;
   a reference generator adapted to produce a reference voltage at a second node, the reference voltage being based on the value of a known resistance; and
   a comparison circuit adapted to compare the voltage on the first node to the reference voltage on the second node and produce an output signal having a binary value indicative of whether the programmable element has been programmed.

6. The apparatus of claim 5, comprising an equilibrating circuit adapted to equilibrate the voltages at the first and second nodes.

7. The apparatus of claim 5, wherein the programmable element comprises an antifuse element.

8. The apparatus of claim 5, wherein the programmable element comprises an ovonic element.

9. In an integrated circuit, an apparatus comprising:
a plurality of programmable circuits, each programmable circuit comprising:
   a programmable element having a resistance; and
   a first node at which a voltage may be developed that is based on the resistance of the programmable element,
   wherein the first nodes of all the plurality of programmable circuits being joined in a common connection;
selection circuitry adapted to select one of the plurality of programmable circuits;
a reference generator adapted to produce a reference voltage at a second node, the reference voltage being based on the value of a known resistance; and
a comparison circuit adapted to compare the voltage at the first node of the selected programmable circuit to the reference voltage at the second node and to produce an output signal having a binary value indicative of whether the programmable element has been programmed.

10. The apparatus of claim 9, comprising an equilibrating circuitry adapted to equilibrate the voltages at the first and second nodes.

11. The apparatus of claim 9, comprising circuitry adapted to vary the value of the known resistance.

12. The apparatus of claim 9, wherein the comparison circuit comprises a comparator.

13. The apparatus of claim 9, wherein the programmable element comprises an antifuse element.

14. The apparatus of claim 9, wherein the programmable element comprises an ovonic element.

15. An integrated circuit, comprising:
a plurality of programmable circuits, each programmable circuit comprising:
   a programmable element having a resistance; and
   a first node at which a voltage may be developed that is based on the resistance of the programmable element,
   wherein the first nodes of all programmable circuits being joined in a common connection;
a decoder adapted to decode a first address signal and to send a first enabling signal to each of the plurality of programmable circuits;
a reference circuit adapted to produce a reference voltage at a second node, the reference voltage being based on the value of a known resistance; and
a comparator circuit adapted to compare the voltage at the first node of the selected programmable circuit to the reference voltage at the second node and to produce an output signal having a binary value indicative of whether the programmable element has been programmed.

16. The apparatus of claim 15, wherein the the programmable element comprises an antifuse element.

17. The apparatus of claim 15, wherein the programmable element comprises an ovonic element.

18. A semiconductor memory device, comprising:
a memory array;
a plurality of programmable circuits, each programmable circuit comprising:
   a programmable element having a resistance; and
   a first node at which a voltage may be developed that is based on the resistance of the programmable element,
   wherein the first nodes of all programmable circuits being joined in a common connection;
a circuit adapted to produce a first voltage at a first node based on a known resistance;
a reference circuit adapted to produce a second voltage at a second node based on the resistance of a programmable element; and
a comparison circuit adapted to compare the first voltage to the second voltage and producing an output signal having a binary value in response to the comparison, the binary value of the output signal indicating whether the programmable element has been programmed.

19. The apparatus of claim 18, comprising:
an equilibrating circuit adapted to equilibrate the voltages at the first and second nodes.

20. The apparatus of claim 18, wherein the programmable element comprises an antifuse element.

21. The apparatus of claim 18, wherein the programmable element comprises an ovonic element.

* * * * *